United States Patent
Yabu

(10) Patent No.: US 9,229,312 B2
(45) Date of Patent: Jan. 5, 2016

(54) EXPOSURE APPARATUS, MEASUREMENT METHOD, STABILIZATION METHOD, AND DEVICE FABRICATION METHOD

(75) Inventor: Nobuhiko Yabu, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 776 days.

(21) Appl. No.: 13/102,739

(22) Filed: May 6, 2011

(65) Prior Publication Data
US 2011/0212394 A1 Sep. 1, 2011

Related U.S. Application Data

(63) Continuation of application No. 12/416,610, filed on Apr. 1, 2009, now Pat. No. 7,961,295.

(30) Foreign Application Priority Data

Apr. 11, 2008 (JP) .................................. 2008-104030

(51) Int. Cl.
*G03B 27/53* (2006.01)
*G03B 27/68* (2006.01)
*G03B 27/32* (2006.01)
*G03B 27/42* (2006.01)
*G03F 7/20* (2006.01)

(52) U.S. Cl.
CPC ................ *G03B 27/32* (2013.01); *G03B 27/42* (2013.01); *G03F 7/70425* (2013.01); *G03F 7/70941* (2013.01)

(58) Field of Classification Search
CPC .................................................... G03F 7/70425
USPC ......................................... 355/52, 53, 55, 72
See application file for complete search history.

(56) References Cited

U.S. PATENT DOCUMENTS

| | | | | |
|---|---|---|---|---|
| 7,060,622 B2* | 6/2006 | Miyamori et al. | ............ | 438/697 |
| 7,483,117 B2* | 1/2009 | Hirukawa | ......... | 355/30 |
| 7,586,605 B2* | 9/2009 | Fukuhara | ...... | 356/364 |
| 7,724,018 B2* | 5/2010 | Johnson | ............. | 324/750.02 |
| 7,961,295 B2* | 6/2011 | Yabu | ............... | 355/53 |
| 2009/0135389 A1* | 5/2009 | Hofmans et al. | ............ | 355/55 |

* cited by examiner

*Primary Examiner* — Hung Henry Nguyen
(74) *Attorney, Agent, or Firm* — Canon USA, Inc. IP Division

(57) ABSTRACT

The present invention provides an exposure apparatus including a projection optical system configured to project a reticle pattern onto a wafer, a selector configured to select a dummy wafer to be placed near an image plane of the projection optical system, from a plurality of dummy wafers having the same shape as that of the wafer and different reflectance with each other, a transfer unit configured to place the dummy wafer selected by the selector near the image plane of the projection optical system, and a controller configured to perform control such that dummy exposure is performed by irradiating the dummy wafer, which is placed near the image plane of the projection optical system by the transfer unit, with light via the projection optical system.

20 Claims, 8 Drawing Sheets

FIG. 7

| | SLOT No. | REFLECTANCE [%] | CUMULATIVE IRRADIATION ENERGY [J] | LIMIT IRRADIATION ENERGY [J] |
|---|---|---|---|---|
| DW1 | **** | **** | **** | **** |
| DW2 | **** | **** | **** | **** |
| DW3 | *** | *** | *** | *** |
| ... | | | | |
| DWn | **** | *** | *** | *** |

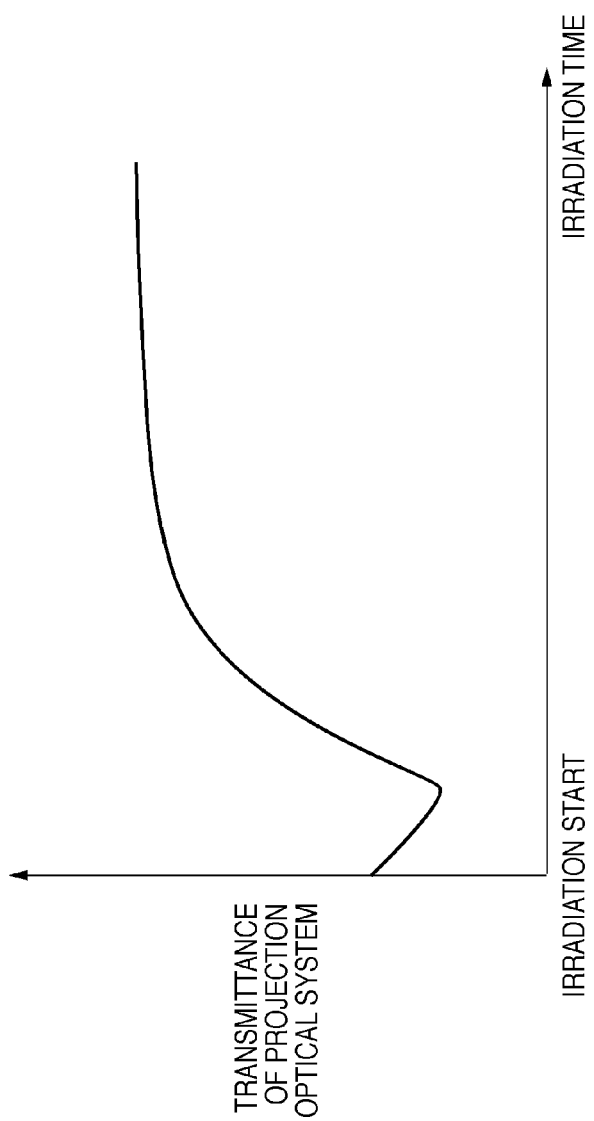

EXPOSURE APPARATUS, MEASUREMENT METHOD, STABILIZATION METHOD, AND DEVICE FABRICATION METHOD

CROSS-REFERENCE TO RELATED APPLICATIONS

This application claims the benefit of U.S. application Ser. No. 12/416,610, filed Apr. 1, 2009, now U.S. Pat. No. 7,961,295, issued on Jun. 14, 2011, and Japanese Patent Application No. 2008-104030 filed on Apr. 11, 2008, which are hereby incorporated by reference herein in its entirety.

BACKGROUND OF THE INVENTION

1. Field of the Invention

The present invention relates to an exposure apparatus, a measurement method, a stabilization method, and a device fabrication method.

2. Description of the Related Art

A projection exposure apparatus has conventionally been used when fabricating fine semiconductor devices such as an LSI and ULSI by using the photolithography technique. In this projection exposure apparatus, a projection optical system transfers a circuit pattern formed on a reticle (mask) onto a substrate such as a wafer by projecting the circuit pattern onto the substrate.

Recently, as demands for micropatterning of semiconductor devices increase, the projection exposure apparatus is beginning to require high resolution, and attempts are being made to obtain a short wavelength of exposure light and a high numerical aperture (NA) of the projection optical system (i.e., to increase the NA of the projection optical system). When increasing the resolution, however, the depth of focus decreases, and this makes it necessary to increase the accuracy of focusing to match the surface of a wafer with the image formation plane (focusing plane) of the projection optical system.

Also, in the projection exposure apparatus, the accuracy of alignment that accurately aligns circuit patterns transferred in a plurality of steps is one important characteristic. Since the fluctuation in magnification of the projection optical system largely influences this alignment accuracy, it is extremely important to maintain the magnification of the projection optical system at a predetermined value (constant value).

On the other hand, when irradiated with exposure light, the projection optical system absorbs part of the energy of this exposure light. Heat generated by this absorption changes the temperature, and the optical characteristics (e.g., the magnification and aberration) of the projection optical system change. If the projection optical system is kept irradiated with the exposure light, therefore, the optical characteristics of the projection optical system fluctuate, and the focusing accuracy or alignment accuracy may decrease (i.e., a non-negligible focusing error or alignment error may occur).

Accordingly, Japanese Patent Publication No. 63-16725 has proposed a technique that corrects the fluctuations in optical characteristics of the projection optical system caused by irradiation with the exposure light. In this technique disclosed in Japanese Patent Publication No. 63-16725, the fluctuations (fluctuation amounts) of optical characteristics of the projection optical system caused by irradiation with the exposure light are calculated by a model expression using the exposure amount, exposure time, non-exposure time, and the like as parameters, and the fluctuations in optical characteristics of the projection optical system are corrected based on the calculation result.

The above-mentioned model expression has a coefficient (correction coefficient) unique to the projection optical system for each optical characteristic of the projection optical system. To calculate this correction coefficient, it is necessary to measure the fluctuation in optical characteristic by actually irradiating the projection optical system with the exposure light. The application of the exposure light to the projection optical system performed for purposes, such as the calculation of the correction coefficient, other than intended exposure (i.e., exposure for transferring a reticle pattern onto a wafer) will be referred to as "dummy exposure" hereinafter.

Dummy exposure may be performed for purposes other than the calculation of the correction coefficient. For example, dummy exposure is performed to stabilize the transmittance of the projection optical system. When emission and pause of the exposure light (e.g., an excimer laser) is repeated, quartz, which is generally used as the glass material of the projection optical system, abruptly changes the transmittance due to the emission time and pause time of the exposure light. More specifically, as shown in FIG. 9, the transmittance of the projection optical system temporarily decreases immediately after the emission (exposure) of the exposure light is started, starts increasing from a certain point, and saturates at a certain value when the exposure light emission continues. It is very difficult to correct this abrupt change in transmittance. As disclosed in Japanese Patent Laid-Open No. 10-116766, therefore, it is effective to stabilize the transmittance of the projection optical system by performing dummy exposure of about tens of thousands of pulses before starting (resuming) exposure. FIG. 9 is a graph showing the change in transmittance of the projection optical system as a function of the emission time (exposure time) of the exposure light. Referring to FIG. 9, the ordinate indicates the transmittance of the projection optical system, and the abscissa indicates the emission time of the exposure light.

The exposure light of dummy exposure passes through almost the same optical path as that of the exposure light of intended exposure. Accordingly, if dummy exposure is performed with a wafer being placed on a wafer stage (i.e., with a wafer being set in the exposure position), the wafer is exposed and becomes unusable as a product, so the exposure light of dummy exposure must irradiate an object other than the wafer. Therefore, an object (for dummy exposure) to be irradiated with the exposure light of dummy exposure is fixed on the wafer stage, and set in the exposure position when performing dummy exposure.

When fixing the object for dummy exposure on the wafer stage, however, a space for fixing the object must be secured, and this upsizes the wafer stage.

Also, in dummy exposure for calculating the correction coefficient, the object for dummy exposure preferably has the same reflectance as that of a wafer for fabricating an actual product, in order to measure the fluctuation in optical characteristic of the projection optical system in intended exposure. However, the object for dummy exposure generally has a reflectance and shape different from those of a wafer. Therefore, the fluctuation in optical characteristic of the projection optical system in dummy exposure differs from that in optical characteristic of the projection optical system in intended exposure. This makes it difficult to accurately calculate the correction coefficient. This is so because if the intensity of reflected light from the object for dummy exposure differs from that of reflected light from a wafer, an optical characteristic fluctuation different from that in intended exposure occurs.

In dummy exposure for stabilizing the transmittance of the projection optical system, the transmittance of the projection optical system can be stabilized more efficiently (i.e., within a shorter time) when the amount of light returning to the final plane (the plane closest to a wafer) of the projection optical system is larger. Accordingly, the object for dummy exposure must have a highest reflectance. This requirement does not match the requirement for the reflectance of the object for dummy exposure for calculating the correction coefficient.

The above problem can be solved by fixing a plurality of objects for dummy exposure different in reflectance on the wafer stage. However, if the number of the objects for dummy exposure increases, the area of the space to be secured on the wafer stage increases.

Also, when the object for dummy exposure fixed on the wafer stage is irradiated with the exposure light for a long time, the object raises the temperature of the wafer stage, and mechanisms (e.g., a holding mechanism for holding a wafer) of the wafer stage thermally deform.

Furthermore, even when the object for dummy exposure is made of a material having a resistance to the exposure light such as an excimer laser, the surface of the object deteriorates and changes its properties if the object is irradiated with the exposure light for a long time, so the object must be exchanged. However, the object for dummy exposure is fixed on the wafer stage as described previously, and this makes the work of exchanging the object difficult and cumbersome.

SUMMARY OF THE INVENTION

The present invention provides an exposure apparatus capable of increasing the degree of freedom of dummy exposure without causing upsizing and thermal deformation of a wafer stage.

According to one aspect of the present invention, there is provided an exposure apparatus including a projection optical system configured to project a reticle pattern onto a wafer, a selector configured to select a dummy wafer to be placed near an image plane of the projection optical system, from a plurality of dummy wafers having the same shape as that of the wafer and different reflectance with each other, a transfer unit configured to place the dummy wafer selected by the selector near the image plane of the projection optical system, and a controller configured to perform control such that dummy exposure is performed by irradiating the dummy wafer, which is placed near the image plane of the projection optical system by the transfer unit, with light via the projection optical system.

Further aspects of the present invention will become apparent from the following description of an exemplary embodiment with reference to the attached drawings.

BRIEF DESCRIPTION OF THE DRAWINGS

FIG. 7 is a view showing an example of a database representing information pertaining to a plurality of dummy wafers contained in a container of the exposure apparatus shown in FIG. 1.

FIG. 9 is a graph showing the change in transmittance of a projection optical system as a function of the emission time (exposure time) of exposure light.

DESCRIPTION OF THE EMBODIMENT

Figure 1:
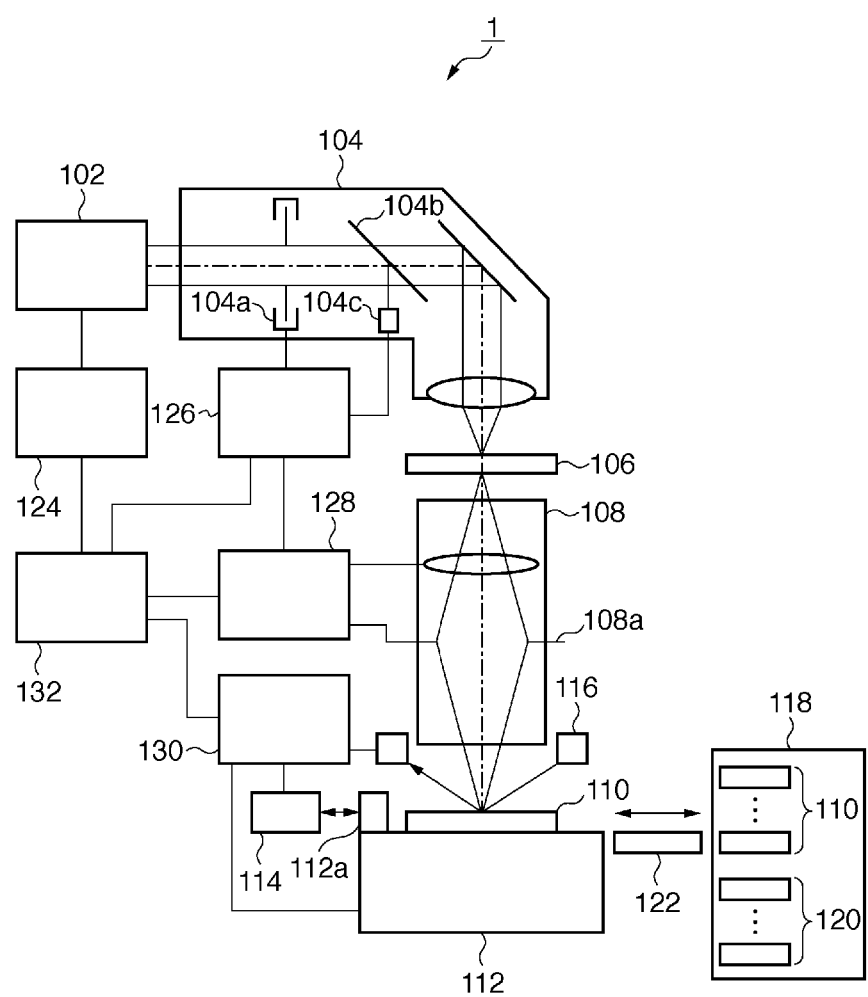
FIG. 1 a schematic view showing an exposure apparatus according to one aspect of the present invention.

An embodiment of the present invention will be explained below with reference to the accompanying drawings. Note that the same reference numerals denote the same parts in these drawings, and repetitive explanations thereof will be omitted.

FIG. 1 is a schematic view showing the arrangement of an exposure apparatus 1 according to an aspect of the present invention. In this embodiment, the exposure apparatus 1 is a projection exposure apparatus for transferring a reticle pattern onto a wafer by the step-and-scan method. Note that it is also possible to apply the step-and-repeat method or another exposure method to the exposure apparatus 1.

The exposure apparatus 1 includes a light source 102, an illumination optical system 104, a reticle stage on which a reticle 106 is placed, a projection optical system 108, a wafer stage on which a wafer 110 is placed, an interferometer 114, and a focusing detection unit 116. The exposure apparatus 1 further includes a container 118, dummy wafer 120, transfer unit 122, light source controller 124, illumination controller 126, projection controller 128, stage controller 130, and main controller 132.

The light source 102 is, for example, a pulse laser source such as an ArF excimer laser having a wavelength of about 193 nm or a KrF excimer laser having a wavelength of about 248 nm. The light source 102 includes a front mirror forming a resonator, a diffraction grating for narrowing the wavelength band of exposure light, and a band-narrowing module made of a prism or the like. The light source 102 further includes a monitor module including a spectroscope or detector for monitoring the wavelength stability and spectral width of exposure light, and a shutter.

The illumination optical system 104 illuminates the reticle 106 with light (exposure light) from the light source 102. In this embodiment, the illumination optical system 104 includes a beam shaping optical system for shaping the light from the light source 102 into a predetermined shape, and an optical integrator for forming a large number of secondary light sources in order to illuminate the reticle 106 by a uniform illuminance distribution. The illumination optical system 104 further includes an aperture stop 104a, half mirror 104b, and photosensor 104c.

The aperture stop 104a has a circular aperture having a variable aperture diameter, and sets the numeral aperture (NA) of the illumination optical system 104 to an arbitrary value. The half mirror 104b is placed in the optical path of the illumination optical system 104, and reflects part of the exposure light illuminating the reticle 106. The photosensor 104c is placed in the optical path of the exposure light reflected by the half mirror 104a, and senses the intensity (energy) of the exposure light. The energy sensed by the photosensor 104c is converted into energy per pulse by an integrating circuit that performs integration whenever the light source 102 emits a pulse. This energy per pulse is input to the main controller 132 via the illumination controller 126.

The reticle 106 has a pattern (circuit pattern) to be transferred onto the wafer 110, and is supported and driven by the reticle stage. Since the exposure apparatus 1 is a step-and-scan type exposure apparatus, the pattern of the reticle 106 is transferred onto the wafer 110 by scanning the reticle 106 and wafer 110.

The projection optical system 108 projects the pattern of the reticle 106 onto the wafer 110 at a predetermined reduction ratio magnification (for example, ¼). The projection optical system 108 includes a plurality of optical elements such as lenses, and has an aperture stop 108a on the pupil plane (the Fourier transform plane with respect to the reticle 106). The aperture stop 108a has a circular aperture having a variable aperture diameter, and sets the numerical aperture (NA) of the projection optical system 108 to an arbitrary value.

The wafer 110 is a substrate onto which the pattern of the reticle 106 is projected (transferred), and coated with a photosensitive agent (resist). Note that the wafer 110 may also be replaced with a glass plate or another substrate. Note also that the wafer 110 is contained in the container 118, and picked up and transferred to a wafer stage 112 by the transfer unit 122.

The wafer stage 112 holds the wafer 110 or dummy wafer 120, and drives the wafer 110 or dummy wafer 120 in the direction (Z direction) of the optical axis of the projection optical system 108 and in a plane (X-Y plane) perpendicular to the optical axis of the projection optical system 108.

The interferometer 114 measures the distance to a reflecting mirror 112a fixed on the wafer stage 112, and detects the position of the wafer stage 112 in the X-Y plane. The interferometer 114 inputs the detection result to the stage controller 130.

The focusing detection unit 116 includes a light-emitting optical system for emitting light toward the wafer 110, and a light-receiving optical system for receiving light reflected by the wafer 110, and detects the position of the wafer 110 in the direction (Z direction) of the optical axis of the projection optical system 108. Note that the light-emitting optical system emits, toward the wafer 110, light (non-exposure light) that does not expose the resist applied on the wafer 110. The light-receiving optical system includes a plurality of light-receiving elements corresponding to the light reflected by the wafer 110, and is installed such that the light-receiving surfaces of these light-receiving elements are optically conjugated to the light-reflecting points on the wafer 110. Accordingly, the position (positional deviation) of the wafer 110 in the direction (Z direction) of the optical axis of the projection optical system 108 is detected as the position (positional deviation) of light entering the light-receiving element of the light-receiving optical system.

The container 118 has slots containing and holding a plurality of wafers 110, a plurality of dummy wafers 120, and other wafer-like members.

Figure 2:
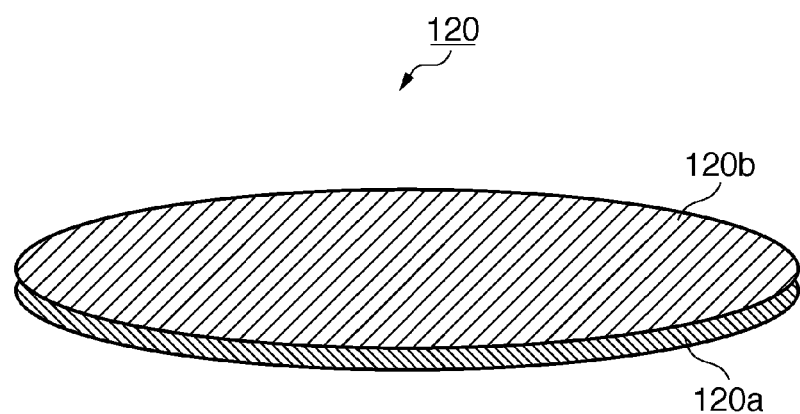
FIG. 2 is a schematic view showing a dummy wafer.

As shown in FIG. 2, each of the plurality of dummy wafers 120 is obtained by forming (depositing) a thin optical film 120b having a film thickness of 1 μm or less on a substrate 120a. The dummy wafer 120 has almost the same shape (size) as that of the wafer 110. The plurality of dummy wafers 120 has different reflectance with each other. This obviates the need for a transfer mechanism and holding mechanism dedicated to transfer and hold the dummy wafer 120, and makes it possible to transfer and hold the dummy wafer 120 by using the transfer mechanism (transfer unit 122) and holding mechanism (wafer stage 112) for transferring and holding the wafer 110. Note that the thin optical film 120b is made of a material having a resistance to the light (exposure light) from the light source 102 (i.e., a material that deteriorates little and changes its properties little when irradiated with the exposure light). Examples are inorganic materials such as silicon nitride (SiN) and silicon oxide ($SiO_2$). FIG. 2 is a schematic view showing the structure of the dummy wafer 120.

The transfer unit 122 operates under the control of the main controller 132. When performing intended exposure (i.e., exposure for transferring the pattern of the reticle 106 onto the wafer 110), the transfer unit 122 picks up the wafer 110 contained in the container 118 and transfers the wafer 110 to the wafer stage 112. Also, when performing dummy exposure that irradiates the projection optical system 108 with the exposure light for a purpose other than intended exposure, the transfer unit 122 picks up and transfers the dummy wafer 120 contained in the container 118 to the wafer stage 112. Accordingly, in cooperation with the wafer stage 112, the transfer unit 122 places the wafer 110 near the image plane of the projection optical system 108 when performing intended exposure, and places the dummy wafer 120 near the image plane of the projection optical system 108 when performing dummy exposure.

The light source controller 124 performs control related to the light source 102 (for example, control for exchanging the gas of the light source 102, control for stabilizing the wavelength of the light emitted from the light source 102, and control of a discharge application voltage). Note that in this embodiment, the light source controller 124 does not singly control the light source 102, but controls the light source 102 in cooperation with the main controller 132.

The illumination controller 126 performs control related to the illumination optical system 104 (for example, control of the aperture diameter of the aperture stop 104a). For example, the illumination controller 126 adjusts a coherence factor (σ value) as the ratio of the NA of the illumination optical system 104 to that of the projection optical system 108 by controlling the aperture diameter of the aperture stop 104a. Note that in this embodiment, the illumination controller 126 does not singly control the illumination optical system 104, but controls the illumination optical system 104 in cooperation with the main controller 132.

The projection controller 128 performs control related to the projection optical system 108 (for example, control of the aperture diameter of the aperture stop 108a, and lens driving control). For example, the projection controller 128 drives lenses (e.g., a field lens) forming the projection optical system 108 in the optical-axis direction by using an air pressure or piezoelectric element, thereby adjusting various aberrations and the magnification of the projection optical system 108. Note that in this embodiment, the projection controller 128 does not singly control the projection optical system 108, but controls the projection optical system 108 in cooperation with the main controller 132.

The stage controller 130 performs control related to the wafer stage 112 (for example, driving (scanning) control and positioning control of the wafer stage 112). For example, the stage controller 130 controls the wafer stage 112 based on the detection results from the interferometer 114 and focusing detection unit 116, so as to position the wafer 110 at a predetermined position in the Z direction and in the X-Y plane. Note that in this embodiment, the stage controller 130 does not singly control the wafer stage 112, but controls the wafer stage 112 in cooperation with the main controller 132.

The main controller 132 has a function of controlling the whole (operation) of the exposure apparatus 1, and particularly controls operations concerning dummy exposure in this embodiment. For example, as will be described later, the main controller 132 functions as a selector for selecting a dummy wafer to be placed near the image plane of the projection optical system 108 from the plurality of dummy wafers 120 contained in the container 118. The main controller 132 also functions as a determination unit for determining whether the change in reflectance of the dummy wafer 120 placed near the image plane of the projection optical system 108 falls within an allowable range, or whether the energy amount of light irradiating the dummy wafer 120 falls within an allowable range. Note that the main controller 132 manages information pertaining to the dummy wafers 120 contained in the container 118 (for example, the types and transfer logs of these dummy wafers), and stores the information in a storage unit such as a memory.

The fluctuations in optical characteristics of the projection optical system 108 caused by irradiation with the exposure light will be explained below. The aberration of the projection optical system 108 will be explained as an example of the optical characteristics of the projection optical system 108. Note that the optical characteristics of the projection optical system 108 are not limited to the aberrations such as the distortion, astigmatism, spherical aberration, and comatic aberration, and also include focusing and the magnification.

Figure 3:
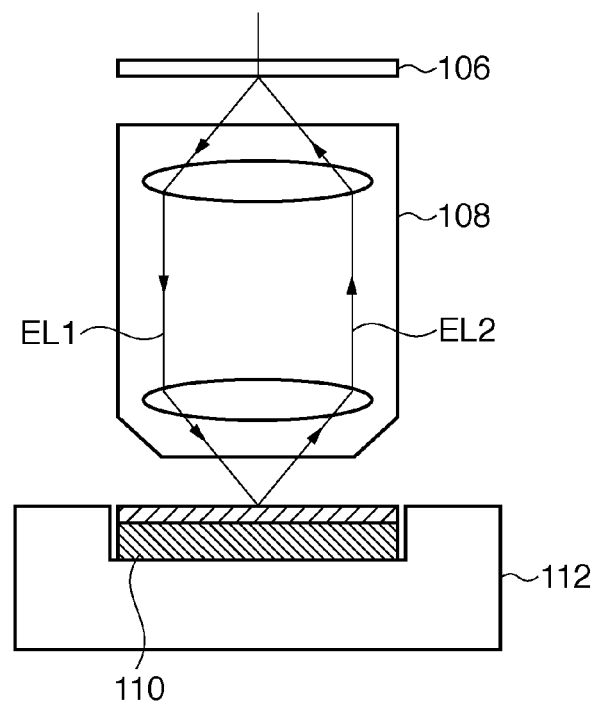
FIG. 3 is a view showing the optical paths of exposure light in a projection optical system of the exposure apparatus shown in FIG. 1.

As shown in FIG. 3, the projection optical system 108 fluctuates the optical characteristics under the influence of exposure light EL1 irradiating (entering) the projection optical system 108 after passing through the reticle 106 and exposure light EL2 reflected by the wafer 110 after passing through the projection optical system 108. Note that the intensity ratio of the exposure light EL1 to the exposure light EL2 depends on the reflectance of the surface of the wafer 110, and the reflectance of the surface of the wafer 110 changes in accordance with the type and thickness of the resist (and an antireflection film) applied on the wafer 110. FIG. 3 is a view showing the optical paths of the exposure light in the projection optical system 108.

Figure 4:
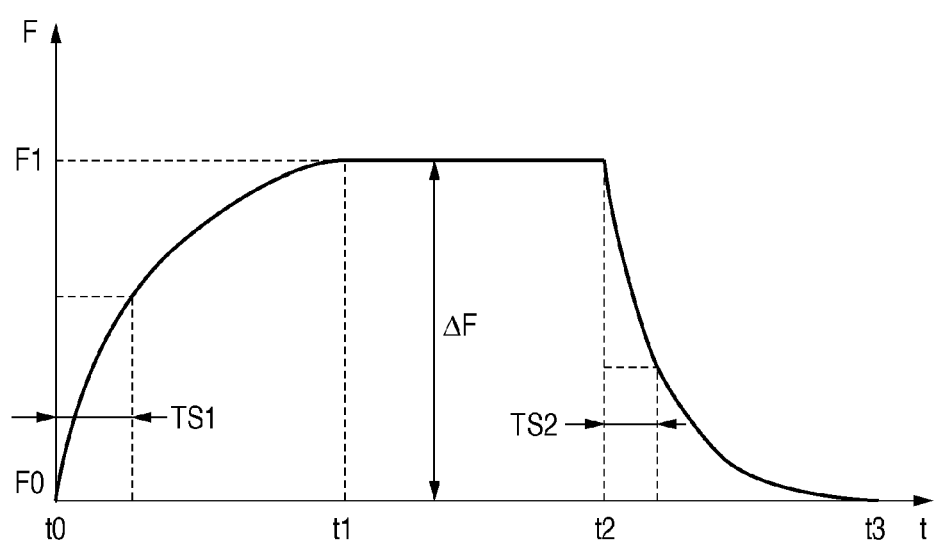
FIG. 4 is a graph showing an example of the fluctuation (change with time) in aberration of the projection optical system of the exposure apparatus shown in FIG. 1.

FIG. 4 is a graph showing an example of the fluctuation (change with time) of aberration of the projection optical system 108. In FIG. 4, the ordinate indicates an aberration F of the projection optical system 108, and the abscissa indicates time t. Note that the value of a fluctuation amount $\Delta F$ of the aberration of the projection optical system 108 changes for each image height of the projection optical system 108. FIG. 4 shows the fluctuation in aberration of the projection optical system 108 at a certain image height. Note also that the aberration amount of the projection optical system 108 before exposure (i.e., before the projection optical system 108 is irradiated with the exposure light) is F0.

Referring to FIG. 4, when exposure is started from time t0, the aberration of the projection optical system 108 fluctuates with the elapse of time, and reaches a certain amount (saturation amount) F1 at time t1. After time t1, the aberration of the projection optical system 108 does not change from the saturation amount F1 although the projection optical system 108 is irradiated with the exposure light, because the thermal energy absorbed by the projection optical system 108 and the thermal energy emitted by the projection optical system 108 have reached an equilibrium state. When exposure is stopped at time t2, the aberration of the projection optical system 108 returns to the initial state with the elapse of time, and returns to the aberration amount F0 before exposure at time t3.

The saturation value F1 of the fluctuation in aberration of the projection optical system 108 is represented by equation 1 below by using a fluctuation amount K of the aberration per unit light amount (unit exposure energy), and exposure energy Q entering the projection optical system 108. Note that the exposure energy Q entering the projection optical system 108 is calculated from parameters (for example, information of the exposure amount, scanning rate, and exposure region) determining the exposure energy.

$$F1 = K \times Q \tag{1}$$

Letting $\Delta F_k$ be the aberration amount of the projection optical system 108 at a certain time, an aberration amount $\Delta F_{k+1}$ of the projection optical system 108 after exposure is performed for a time $\Delta t$ from the certain time is approximated by a model expression represented by equation 2 below by using the saturation amount F1 and a time constant TS1 on the leading edge.

$$\Delta F_{k+1} = \Delta F_k + F1 \times (1 - \exp(-\Delta t/TS1)) \tag{2}$$

Similarly, letting $\Delta F_k$ be the aberration amount of the projection optical system 108 at a certain time, the aberration amount $\Delta F_{k+1}$ of the projection optical system 108 after exposure is stopped for the time $\Delta t$ from the certain time is approximated by a model expression represented by equation 3 below by using a time constant TS2 on the trailing edge.

$$\Delta F_{k+1} = \Delta F_k \times \exp(-\Delta t/TS2) \tag{3}$$

Note that the time constants TS1 and TS2 are equivalent to time constants in the heat transfer characteristic of the projection optical system 108, and are coefficients (correction coefficients) unique to the projection optical system 108.

As described above, the fluctuation in aberration of the projection optical system 108 caused by irradiation with the exposure light can be calculated by modeling the fluctuation in aberration of the projection optical system 108 by using equations 1 to 3. However, expressions used to model the fluctuation in aberration of the projection optical system 108 are not limited to equations 1 to 3. It is also possible to model the fluctuation in aberration of the projection optical system 108 by using other expressions.

The time constants TS1 and TS2 used as the correction coefficients in the model expressions for calculating the fluctuation (fluctuation amount) of optical characteristic of the projection optical system 108 change their values from one optical characteristic to another of the projection optical system 108. Accordingly, the time constants TS1 and TS2 must be calculated for each optical characteristic of the projection optical system 108.

Figure 5:
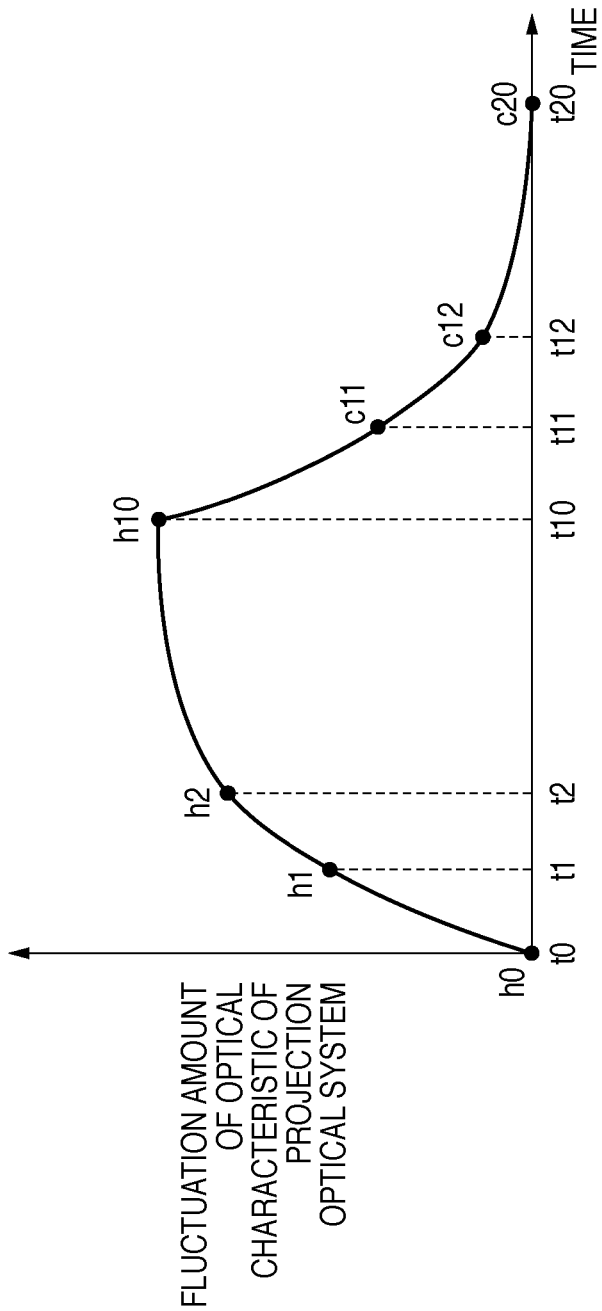
FIG. 5 is a graph showing the fluctuation in optical characteristic of the projection optical system of the exposure apparatus shown in FIG. 1.

A method of calculating the time constants TS1 and TS2 will be explained below with reference to FIG. 5. FIG. 5 is a graph showing the fluctuation in optical characteristic of the projection optical system 108. In FIG. 5, the ordinate indicates the fluctuation amount of the optical characteristic of the projection optical system 108, and the abscissa indicates the time.

Referring to FIG. 5, the projection optical system 108 is continuously irradiated with the exposure light from time t0 to time t10. This state indicates the fluctuation in optical characteristic of the projection optical system 108 on the leading edge. The projection optical system 108 is not irradiated with the exposure light from time t10 to time t20. This state indicates the fluctuation in optical characteristic of the projection optical system 108 on the trailing edge.

When calculating the time constant TS1 on the leading edge, the projection optical system 108 is continuously irradiated with the exposure light, and fluctuation amounts h1, h2, ..., h10 of the optical characteristic of the projection optical system 108 are measured at arbitrary timings from time t0 to time t10. The time constant TS1 on the leading edge can be calculated by approximating the fluctuation amounts h1, h2, ..., h10 of the optical characteristic of the projection optical system 108 by equation 2.

Likewise, when calculating the time constant TS2 on the trailing edge, fluctuation amounts c11, c12, ..., c20 of the optical characteristic of the projection optical system 108 are measured at arbitrary timings from time t10 to time t20 without irradiating the projection optical system 108 with the exposure light. The time constant TS2 on the trailing edge can be calculated by approximating the fluctuation amounts c11, c12, ..., c20 of the optical characteristic of the projection optical system 108 by equation 3.

As described above, to calculate the correction coefficients (time constants TS1 and TS2) used in the model expressions representing the fluctuation (fluctuation amount) of optical characteristic of the projection optical system 108, (the fluctuation of) the optical characteristic of the projection optical system 108 must be measured at arbitrary timings while performing dummy exposure.

A measurement method of measuring the fluctuation (fluctuation amount) of aberration as the optical characteristic of the projection optical system 108 while performing dummy exposure that irradiates the projection optical system 108 with the exposure light in the exposure apparatus 1 of this embodiment will be explained below with reference to FIG. 6. The main controller 132 executes this measurement method by comprehensively controlling the individual units of the exposure apparatus 1.

Note that in this embodiment, the container 118 contains the plurality of dummy wafers 120, and, as information concerning the plurality of dummy wafers 120 contained in the container 118, the main controller 132 stores a database as shown in FIG. 7 in a storage unit such as a memory. FIG. 7 is a view showing an example of the database representing the information pertaining to the plurality of dummy wafers 120 contained in the container 118.

As shown in FIG. 7, the information concerning the plurality of dummy wafers 120 (DW1, DW2, DW3, ..., DWn in FIG. 7) includes the slot number (slot No.) indicating a slot where the wafer is contained in the container 118, the reflectance, the cumulative irradiation energy, and the limit irradiation energy. The reflectance of each of the plurality of dummy wafers 120 is a reflectance to the exposure light (for example, an ArF excimer laser having a wavelength of 193 nm) for exposing the wafer 110. This reflectance can be measured by a reflectance measurement apparatus, and can also be calculated from the thickness or optical constant of the thin optical film 120b. The information pertaining to the plurality of dummy wafers 120 may also be the reflectance at each angle (incident angle), polarized state, and wavelength of the exposure light irradiating the dummy wafer 120. The cumulative irradiation energy is the cumulative value of the energies (energy amounts) of the exposure light having irradiated each of the plurality of dummy wafers 120. The limit irradiation energy is a limiting value with respect to the cumulative irradiation energy (cumulative energy amount) of each of the plurality of dummy wafers 120. The limit irradiation energy is defined by evaluating the durability against the exposure light by an experiment or simulation for each of the plurality of dummy wafers 120. Note that the information concerning the plurality of dummy wafers 120 shown in FIG. 7 is an example, and it is also possible to include other information or partially delete the information shown in FIG. 7 as needed.

Figure 6:
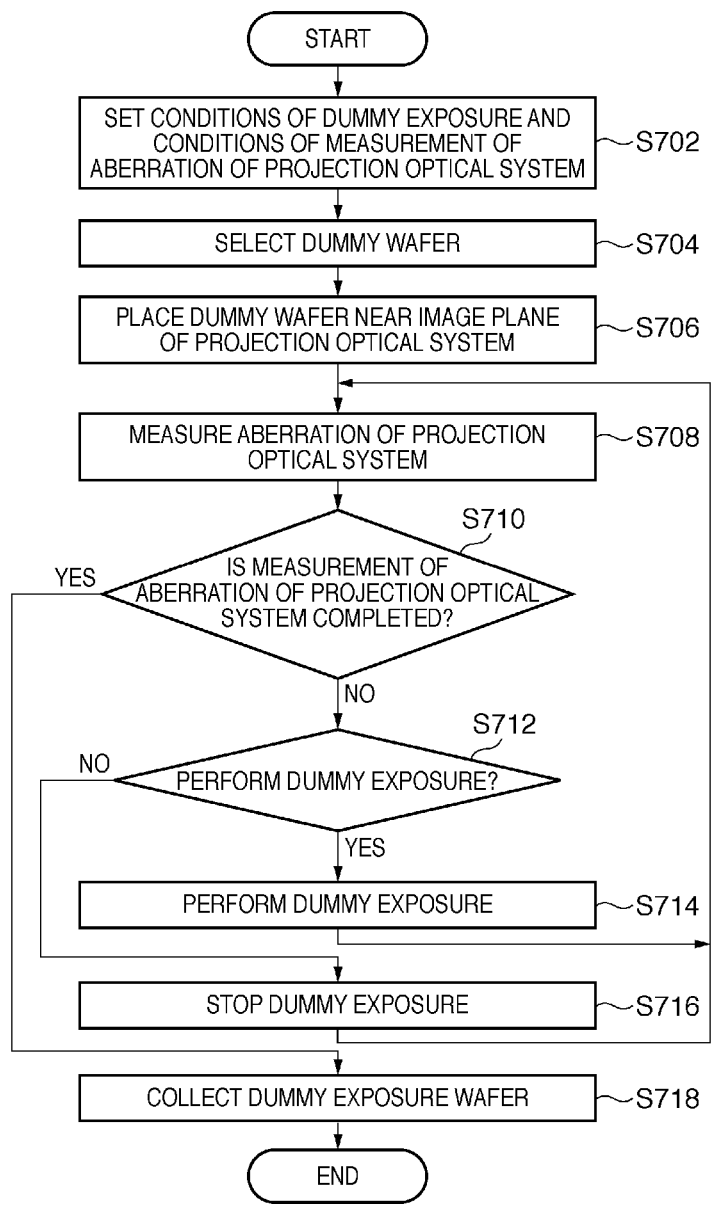
FIG. 6 is a flowchart for explaining a measurement method of measuring the fluctuation (fluctuation amount) of optical characteristic of the projection optical system while performing dummy exposure that irradiates the projection optical system with exposure light in the exposure apparatus shown in FIG. 1.
Figure 8:
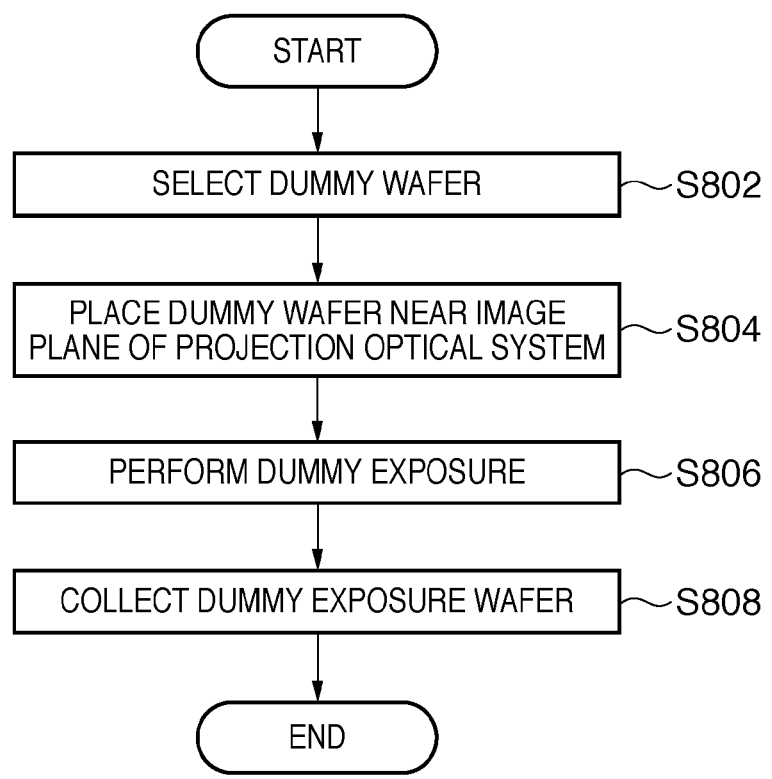
FIG. 8 is a flowchart for explaining a stabilization method of stabilizing the transmittance of the projection optical system by performing dummy exposure that irradiates the projection optical system with exposure light in the exposure apparatus shown in FIG. 1.

In step S702 of FIG. 6, dummy exposure conditions concerning dummy exposure and measurement conditions concerning measurement of the aberration of the projection optical system 108 are set. The dummy exposure conditions include the energy of the exposure light irradiating the projection optical system 108, the irradiation time, the irradiation region, and the stop time during which the irradiation of the projection optical system 108 with the exposure light is stopped. The measurement conditions include the timing at which the aberration of the projection optical system 108 is measured, the number and positions of measurement points, the wavelength of the exposure light of intended exposure (i.e., exposure to the wafer 110), and the reflectance of the wafer 110 to the exposure light. The reflectance of the wafer 110 can be set for each wavelength, each incident angle, or each polarized state of the exposure light. The reflectance of the wafer 110 may also be measured by a reflectance measurement apparatus, or calculated from the optical physical property values of the resist or antireflection film applied on the wafer 110.

Then, in step S704, the dummy wafer 120 to be used in dummy exposure is selected from the plurality of dummy wafers 120 contained in the container 118. More specifically, a dummy wafer 120 having a reflectance closest to that of the wafer 110 is selected by comparing the wavelength of exposure light set in step S702 and the reflectance of the wafer 110 to the exposure light with the information (database shown in FIG. 7) concerning the dummy wafers 120.

Note that if the reflectance of the wafer 110 is set for each incident angle of the exposure light and the information concerning the dummy wafer 120 includes the reflectance at each incident angle of the exposure light, the root mean square of the reflectance difference of each incident angle is calculated between the wafer 110 and each of the plurality of dummy wafers 120, and a dummy wafer 120 that minimizes the root means square of the reflectance difference is selected. Also, if the reflectance of the wafer 110 is set for each polarized state of the exposure light and the information pertaining to the dummy wafer 120 includes the reflectance for each polarized state of the exposure light, the reflectance for the polarized state of the exposure light is evaluated between the wafer 110 and each of the plurality of dummy wafers 120, and a dummy wafer 120 having a reflectance closest to that of the wafer 110 is selected.

If the container 118 contains only one dummy wafer 120, one dummy wafer 120 is selected in step S704. Note that in step S704, the dummy wafer 120 to be used in dummy exposure may also be selected by taking account of a selection criterion other than the reflectance, for example, the limit irradiation energy, as will be described later. Note also that the operator can select an arbitrary dummy wafer 120 instead of automatic selection of the dummy wafer 120 by the main controller 132. In this case, an identifier is given to each of the plurality of dummy wafers 120 in accordance with the information (database shown in FIG. 7) concerning the plurality of dummy wafers 120, and the operator selects a dummy wafer 120 by designating an identifier.

If the information concerning the dummy wafer 120 is not stored in the storage unit such as the memory of the main controller 132, a dimensional, electrical, magnetic, or optical feature representing the information concerning the dummy wafer 120 need to be formed on each of the plurality of dummy wafers 120. This makes it possible to identify (discriminate) each of the plurality of dummy wafers 120 by reading the feature formed on the dummy wafer 120. It is also possible to measure the reflectances of the plurality of dummy wafers 120 in the container 118.

Subsequently, in step S706, the dummy wafer 120 selected in step S704 is picked up from the container 118, transferred to the wafer stage 112, and placed near the image plane of the projection optical system 108.

In step S708, the aberration of the projection optical system 108 is measured. More specifically, an aberration measurement pattern is set on the object plane of the projection optical system 108, and the aberration of the projection optical system 108 is measured by sensing light having passed through the aberration measurement pattern and projection optical system 108 by a sensor mounted on the wafer stage 112. Note that it is also possible to temporarily collect the dummy wafer 120 from the wafer stage 112 and transfer an aberration measurement wafer instead at the timing at which the aberration of the projection optical system 108 is measured, and measure the aberration of the projection optical system 108 by exposing this aberration measurement wafer. In this case, after the aberration of the projection optical system 108 is measured, the aberration measurement wafer is collected from the wafer stage 112, and the dummy wafer 120 is transferred to the wafer stage 112 and placed near the image plane of the projection optical system 108 again. In an exposure apparatus having a plurality of wafer stages, it is possible to hold an aberration measurement wafer on a wafer stage different from the wafer stage holding the dummy wafer 120 in advance, and exchange the two wafer stages at the timing at which the aberration of the projection optical system 108 is measured. In this case, transfer and collection of the aberration measurement wafer and transfer and collection of the dummy wafer 120 can be performed in parallel. It is also possible to expose a plurality of aberration measurement wafers while sequentially exchanging them, at one timing at which the aberration of the projection optical system 108 is measured.

Then, in step S710, whether the measurement of the aberration of the projection optical system 108 is completed based on the measurement conditions set in step S702 is determined. If it is determined that the measurement of the aberration of the projection optical system 108 is complete, the process advances to step S718. On the other hand, if it is determined that the measurement of the aberration of the projection optical system 108 is not complete, the process advances to step S712.

In step S712, whether to perform dummy exposure based on the dummy exposure conditions set in step S702 is determined. If it is determined that dummy exposure is to be performed, the process advances to step S714. On the other hand, if it is determined that no dummy exposure is to be performed, the process advances to step S716.

In step S714, dummy exposure is performed by irradiating the projection optical system 108 with the exposure light based on the dummy exposure conditions set in step S702. Consequently, the projection optical system 108 is heated, and the aberration of the projection optical system 108 fluctuates. Note that in this dummy exposure, the exposure light is preferably emitted by repeating step-and-repeat by taking account of the durability of the thin optical film 120b of the dummy wafer 120. This process is the same as that when exposing the wafer 110 except that the dummy wafer 120 is not exchanged but always held on the wafer stage 112. After dummy exposure is thus performed in step S714, the process returns to step S708, and the aberration of the projection optical system 108 is measured.

In step S716, dummy exposure is stopped based on the dummy exposure conditions set in step S702. As a consequence, the projection optical system 108 is cooled, and the aberration of the projection optical system 108 fluctuates. After dummy exposure is thus stopped in step S716, the process returns to step S708, and the aberration of the projection optical system 108 is measured.

In step S718, the dummy wafer 120 is collected from the wafer stage 112 and contained in the container 118.

In this embodiment as described above, the fluctuation (see FIGS. 4 and 5) in aberration of the projection optical system 108 in intended exposure can be measured by performing dummy exposure by using the dummy wafer 120 having a reflectance closest to that of the wafer 110. Therefore, the correction coefficients such as the time constants TS1 and TS2 can be accurately calculated from equations 1 to 3.

Note that by measuring the fluctuation in aberration of the projection optical system 108 by changing the exposure conditions such as the shape (effective light source shape) of the exposure light and the shape of the exposure region, it is possible to obtain those correction coefficients of the model expressions for calculating the fluctuation in aberration of the projection optical system 108, which correspond to the exposure conditions.

When the exposure light is emitted for a long time, (the thin optical film 120b of) the dummy wafer 120 deteriorates and changes its properties, so the reflectance of the dummy wafer 120 changes. If the reflectance of the dummy wafer 120 largely changes, the reflectance largely deviates from that of the wafer 110 in intended exposure. This makes it necessary to exchange the dummy wafer 120.

Accordingly, for each of the plurality of dummy wafers 120 contained in the container 118, the main controller 132 manages (updates) the cumulative irradiation energy of the dummy wafer 120 when it is used in dummy exposure. At an arbitrary timing, the main controller 132 determines (evaluates) the cumulative irradiation energy of each of the plurality of dummy wafers 120 contained in the container 118. If a dummy wafer 120 exceeding the limit irradiation energy is found, the dummy wafer 120 thus found is exchanged.

It is also possible to measure the reflectance of each of the plurality of dummy wafers 120 by using a reflectance measurement apparatus, and determine the necessity for exchange of the dummy wafer 120 based on the measurement result. In this case, the reflectances of the plurality of dummy wafers 120 contained in the container 118 are measured at arbitrary timings, and, if a dummy wafer 120 whose reflectance falls outside an allowable range exists, the dummy wafer 120 is exchanged. Note that even when the reflectance falls within the allowable range, if the reflectance has largely changed, it is favorable to exchange the dummy wafer 120, or update the information concerning the dummy wafer 120 stored in the storage unit such as the memory of the main controller 132.

The dummy wafer 120 can be exchanged not only when the dummy wafer 120 is contained in the container 118, but also during dummy exposure. In this case, the cumulative irradiation energy and reflectance of the dummy wafer 120 used in dummy exposure are acquired and the dummy wafer 120 is exchanged based on the above-mentioned determination during dummy exposure.

As described previously, when emission and pause of the exposure light are repeated, the transmittance of quartz generally used as the glass material of the projection optical system 108 abruptly changes due to the emission time and pause time of the exposure light.

A stabilization method of stabilizing the transmittance of the projection optical system 108 by performing dummy exposure that irradiates the projection optical system 108 with the exposure light in the exposure apparatus 1 of this embodiment will be explained below with reference to FIG.

8. The main controller 132 executes this stabilization method by comprehensively controlling the individual units of the exposure apparatus 1.

First, in step S802, a dummy wafer 120 to be used in dummy exposure is selected from the plurality of dummy wafers 120 contained in the container 118. More specifically, a dummy wafer 120 having a highest reflectance is selected from the plurality of dummy wafers 120 contained in the container 118.

Then, in step S804, the dummy wafer 120 selected in step S802 is picked up from the container 118, transferred to the wafer stage 112, and placed near the image plane of the projection optical system 108.

Subsequently, in step S806, dummy exposure is performed by irradiating the projection optical system 108 with the exposure light. Note that this dummy exposure in step S806 need not be the same process as that of intended exposure. If it is desirable to stabilize the transmittance of the projection optical system 108 within a short time, therefore, it is only necessary to continuously emit exposure light having the highest energy. However, the exposure light may also be emitted by repeating step-and-repeat by taking account of the durability of the thin optical film 120b of the dummy wafer 120. Dummy exposure in step S806 is performed until the transmittance of the projection optical system 108 stabilizes.

When the transmittance of the projection optical system 108 has stabilized, dummy exposure is stopped. In step S808, the dummy wafer 120 is collected from the wafer stage 112 and contained in the container 118.

In this embodiment as described above, dummy exposure is performed using a dummy wafer 120 having a highest reflectance among the plurality of dummy wafers 120 contained in the container 118. This increases the amount of exposure light entering the projection optical system 108 after being reflected by the dummy wafer 120. Accordingly, it is possible to efficiently irradiate the projection optical system 108 with the exposure light, and stabilize the transmittance of the projection optical system 108 within a short time.

As described earlier, if dummy exposure is performed for a long time by using the same dummy wafer 120, the dummy wafer 120 is heated and raises the temperature of the wafer stage 112. As a consequence, the mechanism of the wafer stage 112 thermally deforms.

To prevent this, a dummy wafer group including a plurality of dummy wafers 120 having the same reflectance is contained in the container 118, and dummy exposure is performed while sequentially exchanging the plurality of dummy wafers 120 having the same reflectance. Even when the dummy wafer 120 is heated by irradiation with the exposure light, therefore, it is exchanged before the temperature of the wafer stage 112 rises. This makes it possible to prevent thermal deformation of the mechanism of the wafer stage 112. Also, the heat of the dummy wafer 120 heated by irradiation with the exposure light is radiated in the container 118, so the wafer temperature returns to the temperature before dummy exposure before the dummy wafer 120 is used in the next dummy exposure. If the number of dummy wafers 120 is small, however, the dummy wafer 120 heated by irradiation with the exposure light is reused in dummy exposure before the wafer temperature returns to the temperature before dummy exposure. Therefore, it is necessary to prepare a large number of dummy wafers 120 having the same reflectance so that the heat of the dummy wafer 120 heated by irradiation with the exposure light can be well radiated in the container 118.

As described above, the exposure apparatus 1 can increase the degree of freedom of dummy exposure without causing upsizing and thermal deformation of the wafer stage 112. For example, the exposure apparatus 1 can reduce the difference between the fluctuation in optical characteristic of the projection optical system 108 in intended exposure and the fluctuation in optical characteristic of the projection optical system 108 in dummy exposure, and accurately obtain the correction coefficients of the model expressions for calculating the fluctuation in optical characteristic of the projection optical system 108. Consequently, it is possible to accurately calculate the fluctuation in optical characteristic of the projection optical system 108, and adjust the optical characteristic of the projection optical system 108. The exposure apparatus 1 can also efficiently irradiate the projection optical system 108 with the exposure light, and stabilize the transmittance of the projection optical system 108 within a short time. Accordingly, the exposure apparatus 1 can economically provide a high-quality device (e.g., a semiconductor device or liquid crystal display device) with high throughput. Note that the device is fabricated through a step of exposing a substrate (e.g., a wafer or glass plate) coated with a resist (photosensitive agent) by using the exposure apparatus 1, a step of developing the exposed substrate, and other well-known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An apparatus comprising:
   an optical system configured to project a reticle pattern onto a substrate;
   a transfer unit configured to place a wafer, at least one surface on which a film, which is made of a material having resistance to exposure light and is exposed to atmosphere, is formed, on an image plane of the optical system;
   an illumination unit configured to illuminate the surface of the wafer placed on the image plane of the optical system with light via the optical system; and
   a measurement unit configured to measure an optical characteristic of the optical system, and a fluctuation in optical characteristic of the optical system by alternately performing the illumination on the surface of the wafer and the measurement of the optical characteristic of the optical system.

2. The apparatus according to claim 1, wherein when performing exposure for measuring the fluctuation in optical characteristic of the optical system, the transfer unit places the wafer having a reflectance closest to that of the substrate.

3. The apparatus according to claim 2, wherein the optical characteristic of the optical system includes at least one of focusing, magnification, distortion, astigmatism, spherical aberration, and comatic aberration.

4. The apparatus according to claim 1, wherein the material includes an inorganic material.

5. The apparatus according to claim 1, wherein when performing exposure for stabilizing a transmittance of the optical system, the transfer unit places a wafer having a highest reflectance from a plurality of wafers.

6. The apparatus according to claim 1, further comprising a determination unit configured to determine whether a change in reflectance of the wafer falls within an allowable range,
   wherein if the change in reflectance of the wafer falls outside the allowable range, the wafer placed on the image plane of the optical system is exchanged.

7. The apparatus according to claim 1, further comprising a determination unit configured to determine whether an energy amount of the light irradiating the wafer falls within an allowable range,
wherein if the energy amount of the light irradiating the wafer falls outside the allowable range, the wafer placed on the image plane of the optical system is exchanged.

8. A method of measuring a fluctuation in optical characteristic of an optical system which projects a reticle pattern onto a substrate in an apparatus including the optical system, the method comprising:
placing a wafer, at least one surface on which a film, which is made of a material having resistance to exposure light and is exposed to atmosphere, is formed, on an image plane of the optical system; and
measuring the fluctuation in optical characteristic of the optical system by alternately performing an illumination on the surface of the wafer placed on an image plane of the optical system with light via the optical system and a measurement of an optical characteristic of the optical system.

9. A method comprising:
exposing a substrate using an exposure apparatus; and
performing a development process for the exposed substrate,
the exposure apparatus comprising:
an optical system configured to project a reticle pattern onto the substrate;
a transfer unit configured to place a wafer, at least one surface on which a film, which is made of a material having resistance to exposure light and is exposed to atmosphere, is formed, on an image plane of the optical system;
an illumination unit configured to illuminate the surface of the wafer placed on the image plane of the optical system with light via the optical system; and
a measurement unit configured to measure an optical characteristic of the optical system, and a fluctuation in optical characteristic of the optical system by alternately performing the illumination on the surface of the wafer and the measurement of the optical characteristic of the optical system.

10. The method according to claim 8, further comprising placing the wafer having a reflectance closest to that of the substrate when performing exposure for measuring the fluctuation in optical characteristic of the optical system.

11. The method according to claim 10, wherein the optical characteristic of the optical system includes at least one of focusing, magnification, distortion, astigmatism, spherical aberration, and comatic aberration.

12. The method according to claim 9, wherein the material includes an inorganic material.

13. The method according to claim 8, further comprising placing a wafer having a highest reflectance from a plurality of wafers when performing exposure for stabilizing a transmittance of the optical system.

14. The method according to claim 8, further comprising:
determining whether a change in reflectance of the wafer falls within an allowable range; and
exchanging the wafer placed on the image plane of the optical system if the change in reflectance of the wafer falls outside the allowable range.

15. The method according to claim 8, further comprising determining whether an energy amount of the light irradiating the wafer falls within an allowable range,
exchanging the wafer placed on the image plane of the optical system if the energy amount of the light irradiating the wafer falls outside the allowable range.

16. The method according to claim 8, wherein the optical characteristic of the optical system includes at least one of focusing, magnification, distortion, astigmatism, spherical aberration, and comatic aberration.

17. The method according to claim 8, wherein the material includes an inorganic material.

18. The apparatus according to claim 1, wherein the material includes silicon nitride.

19. The apparatus according to claim 1, wherein the material includes silicon oxide.

20. The apparatus according to claim 1, wherein the film is an optical film having a film thickness of 1 µm or less, and the wafer has the same shape as that of the wafer.

* * * * *